United States Patent
Christ et al.

(10) Patent No.: US 11,307,056 B2
(45) Date of Patent: Apr. 19, 2022

(54) SENSOR SWITCH WITH SPREAD SPECTRUM SENSING SIGNAL AND SYNCHRONOUS RECTIFIER

(71) Applicant: CAPTRON Electronic GmbH, Olching (DE)

(72) Inventors: Bernhard Christ, Gauting (DE); Dirk Oldendorf, Alling (DE); Jens Schüler, Althegnenberg (DE); Kilian Hüttenhofer, Munich (DE)

(73) Assignee: CAPTRON ELECTRONIC GMBH, Olching (DE)

(*) Notice: Subject to any disclaimer, the term of this patent is extended or adjusted under 35 U.S.C. 154(b) by 63 days.

(21) Appl. No.: 16/896,151

(22) Filed: Jun. 8, 2020

(65) Prior Publication Data
US 2020/0318997 A1    Oct. 8, 2020

Related U.S. Application Data

(63) Continuation of application No. PCT/EP2019/050528, filed on Jan. 10, 2019.

(30) Foreign Application Priority Data

Jan. 10, 2018 (EP) .................................... 18151060
Jun. 26, 2018 (EP) .................................... 18179754

(51) Int. Cl.
*G01R 27/26* (2006.01)
*G01D 5/24* (2006.01)
(Continued)

(52) U.S. Cl.
CPC ............. *G01D 5/24* (2013.01); *H03K 17/955* (2013.01); *H03K 17/962* (2013.01); *H03K 2217/960735* (2013.01); *H03K 2217/960755* (2013.01)

(58) Field of Classification Search
USPC .......................... 324/658, 660–663, 679, 686
See application file for complete search history.

(56) References Cited

U.S. PATENT DOCUMENTS 6,664,661 B1 * 12/2003 Palata .................. H03K 17/955
                                                                    307/112
8,823,393 B2    9/2014 Aubauer
(Continued)

FOREIGN PATENT DOCUMENTS

JP    H08159705 A    6/1996
JP    H10170572 A    6/1998

OTHER PUBLICATIONS

Ramsden, E. Sensors—Synchronous Detection—Part III. May 23, 2016. Available online at http://www.edscave.com/synchronous-detection-part-3.html.
(Continued)

*Primary Examiner* — Vincent Q Nguyen
(74) *Attorney, Agent, or Firm* — Quarles & Brady LLP; Yakov S. Sidorin

(57) ABSTRACT

A capacitive sensor including a sensor electrode connected to a signal generation circuit and a signal evaluation circuit. The signal generation circuit contains a signal generator that is a noise generator or a pseudo-noise generator, the signal evaluation circuit includes a synchronous rectifier. The synchronous rectifier is connected for synchronization to the signal generator.

22 Claims, 11 Drawing Sheets

(51) Int. Cl.
  *H03K 17/955*  (2006.01)
  *H03K 17/96*  (2006.01)

(56)  References Cited

U.S. PATENT DOCUMENTS

| | | |
|---|---|---|
| 9,157,898 B1 | 10/2015 | Steiner |
| 2008/0186034 A1 | 8/2008 | Scheckenbach |
| 2011/0084709 A1* | 4/2011 | Asjes ................ G01R 27/2605 |
| | | 324/658 |
| 2013/0015866 A1 | 1/2013 | Wendt |

OTHER PUBLICATIONS

European Patent Office. Office Action for application 19151145.0. Mailed on Oct. 12, 2020.
Anonymous, "System Description [The Human Condition]", Jun. 9, 2010. Retrieved from the Internet URL:http://humancond.org/wiki/user/ram/electro/capsense/description. Last Modified on Jun. 9, 2010.
Harrington, B. "Low-Power Synchronous Demodulator Design Considerations." Analog Dialogue 49 (2015).
International Searching Authority, International Search Report and Written Opinion for application PCT/EP2019/050528, dated Apr. 23, 2019.
Japan Patent Office. Notification of Reasons for Refusal for application 2020-538960, dated Oct. 4, 2021. With translation.
Korea Intellectual Property Office. Office Action for application 10-2020-7020773, dated Dec. 14, 2021. With translation.

* cited by examiner

SENSOR SWITCH WITH SPREAD SPECTRUM SENSING SIGNAL AND SYNCHRONOUS RECTIFIER

CROSS-REFERENCE TO RELATED APPLICATIONS

This application is a continuation of pending International Application No. PCT/EP2019/050528 filed on 10 Jan. 2019, which designates the United States and claims priority from European Application No. 18151060.3 filed on 10 Jan. 2018 and European Application No. 18179754.9 filed on 26 Jun. 2018. The disclosure of each of the above-identified applications is incorporated by reference herein.

BACKGROUND

1. Field of the Invention

The invention relates to a capacitive sensor switch that may be used to detect the proximity or direct contact of an object, such as a hand to a sensing surface, and a sensing and evaluation circuit thereof.

2. Description of Relevant Art

A touch sensitive switch for cook tops is disclosed in U.S. Pat. No. 8,823,393 B2. Here, an AC signal is coupled into a sensor plate. An evaluation circuit measures the amplitude of the signal. If a human hand or another conductive object is placed into close proximity of the sensor plate, a capacitive current flows between the sensor plate and the hand, thus reducing the amplitude of the AC signal. The evaluation circuit may include a threshold detector and a window comparator to detect a change in amplitude and to issue a control signal at an output. A disadvantage of this switch in operation is that external signals and noise (which may be coupled to the sensor plate) may change the amplitude of the AC signal which may further trigger an erroneous signal at the output of the evaluation circuit. Another drawback of this type of sensor is the radiation of unwanted signals. As an AC signal is fed into the sensor plate, this signal is radiated or coupled to the environment. If a hand or another conductive object is placed in close proximity to the sensor plate, the signal is capacitively coupled to the hand or the object, thus leading to a larger radiation.

SUMMARY

The embodiments of the invention provide a capacitive proximity sensor characterized by high immunity against external signals and noise, and solve a problem of devising a sensor that produces a significantly lower noise level than the sensors known from related art. A further aspect addressed by the invention is improved reception and evaluation circuit that is small, inexpensive, robust, immune to high electromagnetic interference levels, and can be integrated into a small sensor switch housing without requiring an electronic cabinet for controlling the switch.

In one embodiment, the sensor switch has an electrode that may be a metallic or metalized part. The electrode is connected to signal generating means (signal-generating electronic circuitry) and to evaluation means (signal-evaluation electronic circuitry). The signal generating means is configured to generate an output signal to the electrode and includes a signal generator to provide an AC or RF signal, the frequency of which may be in the range of a few kiloHertz to several megaHertz. There may further be a signal-forming and/or amplifier means (represented by appropriate electronic circuitries), for example to produce a signal of an amplitude that is sufficient for signal detection. Furthermore, there may be filtering means, such as an output bandpass filter circuit, to reduce unwanted signal components and therefore to minimize EMI radiation at the sensor electrode. In a microcontroller-based implementation the bandpass may be formed by the electrode itself (high pass) and a slew rate limiter (low pass) in the output stage. In addition, there may be used protection means configured to prevent damage to the signal generating components from external signals and/or overvoltage pulses that may be capacitively coupled into the sensor electrode. (Such coupling may for example happen by an electrostatic discharge from a person approaching the sensor electrode.) The target overvoltage protection may be carried out by any known means, for example with the use of limiting diodes. The signal generating means and/or the output bandpass filter may be structured in a form of a series capacitance and/or resistance that generates in conjunction with the series resistance and/or impedance of a person touching the sensor electrode a voltage drop at the sensor electrode.

The direct connection of the electrode to signal generating means (electronic circuitry) and to the signal evaluation means causes the reduction of the phase shift between the generated signal and the measured signal, such that a precise synchronous rectification with signal and clock in phase becomes possible. This configuration significantly improves background noise suppression, such that the sensor switch may be used in industrial environments where high level of electromagnetic radiation exists. The integration of the rectified signals removes any other frequency interference signals and eliminates errors caused by distortion in the measured signal. Therefore, the integration significantly increases accuracy and suppression of external interference.

Furthermore, the sensor electrode may be covering a significant (substantial) part (for example, several tens of percent) or the largest part (more than 50 percent) of the sensor housing surface, in which case a comparatively large area is dedicated to the sensor, which in turn increases the sensor sensitivity.

In addition, the largest extent (or dimension, or size) of the switch may be smaller than 15 cm to prevent additional phase shifts to the measured signal and, therefore, increase accuracy and noise suppression accordingly.

The evaluation means electronic circuitry is configured to receive an input signal from the electrode and may provide an input bandpass filter configured for filtering unwanted frequency components from the input. Such components may be external electromagnetic interference from external noise sources. There may also be overvoltage protection means configured for providing a protection in case of electrostatic discharge. Also, an input voltage divider may be employed, to help to increase the dynamic range of the operation of the system. As noise cancellation in the synchronous rectifier only works when the noise signal is in the linear range of the input circuit, a voltage divider increases the dynamic range. The voltage divider may reduce an input voltage which may be larger than the maximum input voltage of the dynamic range to an input voltage within the dynamic range. The input of the evaluation means may be fed via the input bandpass filter to a synchronous rectifier.

In the simplest case, the synchronous rectifier includes a set of switches (which may be switches integrated into a microcontroller) controlled by the signal generator. The switches are followed by a low pass filter which is basically an integrating means. Both switches are activated alternatingly, such that if one switch is open, the other is closed. Instead of two alternatingly or reciprocally operated switches, a SPDT (single pole double throw) switch may be used. The low pass filter or any other filter shown herein may be a filter including discrete electronic components such as resistors and/or capacitors and/or inductors. Preferably, the upper frequency of the low pass filter is chosen to be significantly lower than the clock frequency. (For example, by more than two or even three magnitudes lower.)

In one embodiment, the switches may be connected to the bandpass filter to receive a signal thereof. Each switch is followed by a low pass filter and/or an integrating means to integrate over a certain period of time the incoming signals. The outputs of both low pass filters are fed to a differential amplifier to produce a difference of these signals. This difference value may be delivered to an ADC (analog digital converter or analog-to-digital converter) for further processing. Such an ADC may be a converter which produces a high-resolution digital value representing the analog input voltage. The ADC may have a resolution of 8 bit, 10 bit, or 12 bit or more. In a specific configuration, the ADC may even be a threshold switch or a window comparator to determine if the input value has risen over a certain threshold value or fallen below a threshold value, or the input value is within a certain window of input values. The output of the ADC may further trigger an output signal or generate any action to indicate that the sensor switch has been touched. In the case of higher resolution ADC, even an object in proximity to the sensor switch may be identified, and furthermore the distance to the sensor switch may be indicated.

In another related embodiment, the output of the input bandpass filter is delivered directly to one of the switches and inverted to the other of the switches. Such an inversion may be made by a simple inverting amplifier which has a negative amplification factor which may be $-1$. The outputs of both switches are connected together to a common low pass filter for integration, with is further connected to an ADC. Alternatively, the separate low pass filters may be employed followed by a summing amplifier.

In an embodiment, the synchronous rectifier includes a first switch coupled to a first input lowpass filter, and a second switch coupled to a second input lowpass filter. The first switch and the second switch are connected for synchronization with the input signal to the signal generator such that the synchronous rectifier produces two individual low pass filtered signals or a lowpass filtered difference signal. These signals are from the sections of the input signal at times of a first signal state (for example a high state) and of the sections of the input signal at times of a second signal state (for example a low state) of the signal from the signal generator. Preferably, the switches are switched—and may be switched alternatingly—in phase with the input signal. This means, that the switches may toggle or transition when the input signal transitions. If required, small phase errors may be compensated.

In an embodiment, the input bandpass filter is configured to add a DC bias voltage to the input signal from the sensor electrode such that both, a lowest output voltage of the synchronous rectifier and a highest output voltage of the synchronous rectifier fall into the dynamic range of an ADC or a further circuit connected to the output of the synchronous rectifier.

In all embodiments, there may be an input amplifier directly followed by the input bandpass filter. There may also be an input amplifier following the input bandpass filter. The input amplifier serves to amplify the signals into a range which may easily be processed by the following components.

To obtain a high accuracy and a high noise suppression, the sensor switch circuit components (except for the sensor electrode) may have a reference to a common circuit ground. This means that at least the output of the signal generator may provide a signal referenced to such circuit ground and the ADC has an input referenced to such circuit ground. The filters and amplifiers may also be referenced to said circuit ground.

The whole assembly may be implemented based on a standard microcontroller. In an embodiment, there exist less than 20 or less than 10 resistors together with less than 20 or less than 10 capacitors and no active components between the sensor electrode and the microcontroller. In a simple embodiment, there may only be one microcontroller, 6 resistors and 4 capacitors. Here, the signal generator may be an internal clock generator or even a serial data output. The analog switches are standard analog switches which normally may be used for data acquisition. The ADCs are internal data acquisition components. Here, the signal of the switches may be delivered to external low pass filters and coupled back into the microcontroller to an ADC. Normally, passive low pass filters are difficult to implement in a microcontroller, because these require capacitors which would further require a large chip area, which is very expensive. Therefore, external capacitors and other filter components have to be provided. In this implementation, there exist two signal paths, each including an internal switch, an external low pass filter and an internal ADC. The digital output values of both ADCs are subtracted by the microcontroller and may further be processed for further evaluation. Here, a digital comparison with a threshold value or the estimation of a proximity value may be made.

In general, the integrating synchronous rectifier provides an excellent suppression of external interference and significantly attenuates signals which are not synchronous to the signal of the signal generator. Therefore, any external noise or other signals from a constant frequency source, such as power line frequency signals can easily be suppressed. This results in a significant improvement of noise immunity and detector reliability of a sensor switch. Here, exemplary multiple ADCs are shown. Instead of multiple ADC, a single ADC or a lower number of ADCs together with at least one input multiplexer may be used.

In general, the signal generated by the signal generator may be a narrow band or single frequency signal. Such a signal may have a frequency of for example 100 kHz, 200 kHz, or 1 MHz. The signal may also be a broad band signal, such as a chirp, a frequency sweep signal, a noise signal, which may be a pseudo-noise signal. Therefore, the signal generator may be at least one of a noise generator, a pseudo-noise generator, a chirp signal generator or a frequency sweep signal generator.

Specifically, pseudo-noise signals can easily be generated with a microcontroller. For example, a simple pseudo-random number algorithm (which is also known as a deterministic random bit generator) may be started from an arbitrary initial state using a seed state. Based on this, it will always produce the same sequence of numbers. These numbers may be used to program a timer or counter, or they may be supplied into a shift register which may be operated with a constant clock or may even have a modified pseudo-noise signal controlled clock. Noise signals and pseudo-noise signals have comparatively large bandwidths and therefore result in excellent electromagnetic interference (EMI) properties, because the emission of signals through the sensor electrode is now distributed over a comparatively broad frequency spectrum, and therefore normally easily meets the EMI requirements, which are usually measured by a narrow band measurement. Normally, such broad band signals are difficult to evaluate. In this specific case with a synchronous rectifier, they are as easy to evaluate as narrow band signals. Due to the broad band characteristics, the signals are even less susceptible to external interference. For example, an external narrow band signal which is close to the signal generator's signal, may at least slightly interfere with that signal even through the synchronous rectifier, but it would not interfere with a noise signal as long as it is not correlated to that noise signal. Therefore, specifically the combination of a noise signal and a synchronous rectifier results in a significant improvement over the related art, even if the use of a noise signal alone and the use of a synchronous detector alone would also provide an improvement over the related art.

The disclosed embodiments exhibit significant improvements over the related art. They may use direct connection of the sensor electrode to the signal generating means and evaluation means instead of using separate electrodes for transmission and reception. An integrating synchronous rectifier may be used instead of a sample and hold circuit. A sensor electrode may be covering a significant part (which is defined to be at least between 10% and 50% in one implementation, or even in excess of 50% in another implementation—generally, in excess of 10%) of the sensor housing surface. The largest geometrical extent of the switch may be smaller than 15 cm or 7 cm or 5 cm.

In general, the embodiment shown herein may be used for all kinds of capacitive sensors, such as proximity sensors, fill level sensors, or touch displays.

BRIEF DESCRIPTION OF THE DRAWINGS

In the following, the invention will be described, without limitation of the general inventive concept, with examples of embodiments and with reference to the drawings.

Figure 1:
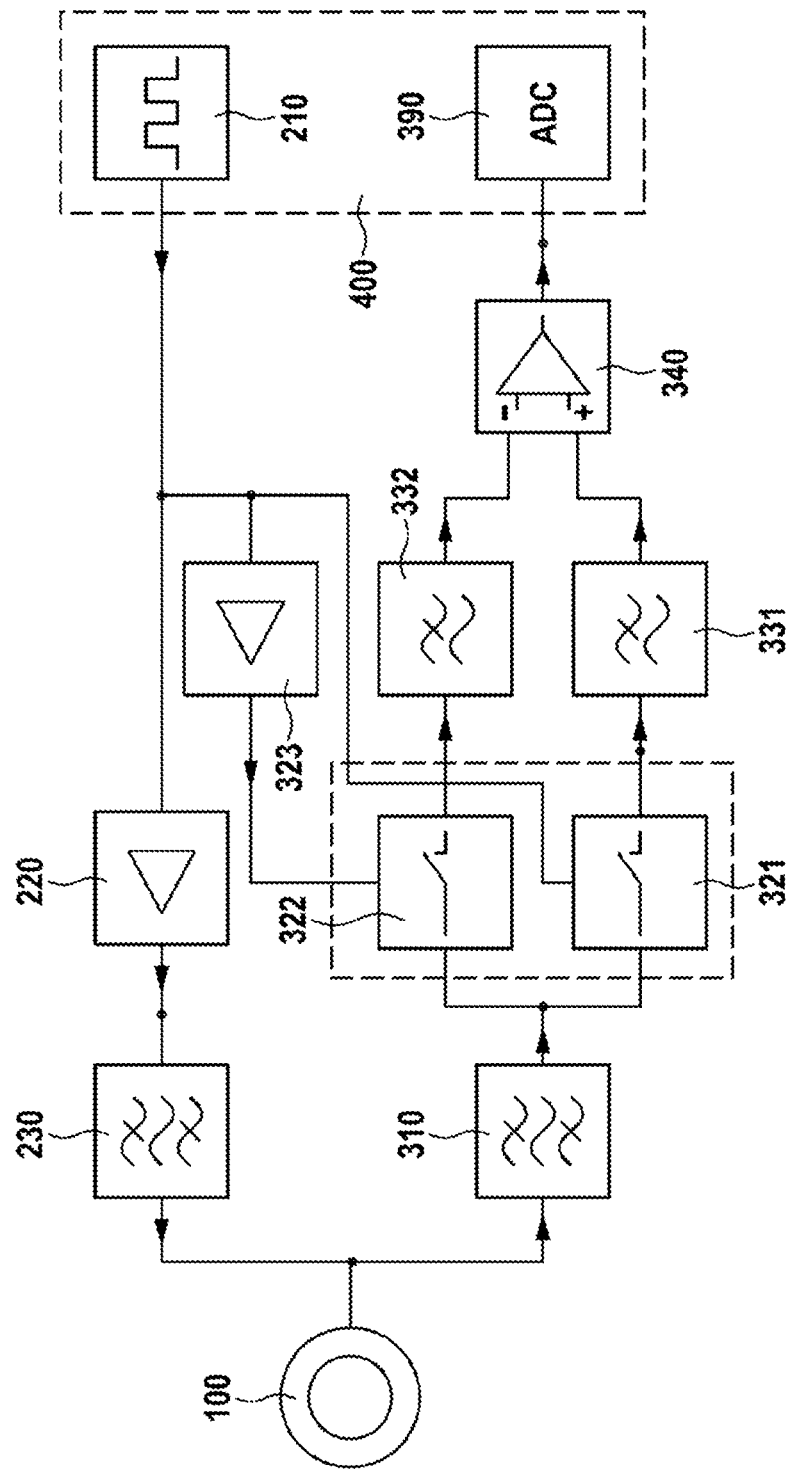
FIG. 1 shows a first embodiment.

Generally, the drawings are not to scale. Like elements and components are referred to by like labels and numerals. For the simplicity of illustrations, not all elements and components depicted and labeled in one drawing are necessarily labeled in another drawing even if these elements and components appear in such other drawing.

While various modifications and alternative forms, of implementation of the idea of the invention, are within the scope of the invention, specific embodiments thereof are shown in the drawings and are described below in detail. It should be understood, however, that the drawings and related detailed description are not intended to limit the implementation of the idea of the invention to the particular form disclosed in this application, but on the contrary, the intention is to cover all modifications, equivalents and alternatives falling within the spirit and scope of the present invention as defined by the appended claims.

DETAILED DESCRIPTION

In FIG. 1, a first embodiment is shown. A signal generator 210 is configured to produce a signal the frequency of which may be in the range of a few kilohertz to many megahertz. The signal is forwarded to an output amplifier 220. The output amplifier may adapt the signal level and impedance of the signal generator to a required value. (Generally, as a person of skill in the art will readily appreciate, this output amplifier may only be necessary, if the signal generator 210 is not able to provide a sufficient signal level.)

The output amplifier 220 may be followed by an output bandpass filter 230 configured to remove unwanted signal components from the output signal. Preferably, the output bandpass filter 230 provides an overvoltage protection. This bandpass filter may further provide a series resistance and/or impedance, which may cause a voltage drop if certain current is drawn through the sensor electrode 100 directly connected to the output bandpass filter 230. The current may be drawn through a resistance and/or impedance of an object, such as for example a hand in close proximity to the sensor electrode 100.

In a very simple configuration, the output amplifier 220 may be configured to provide such components and/or functionalities that the output bandpass filter may be omitted. In an even simpler case, either or both of the output amplifier 220 and the output bandpass filter may be omitted, if the signal generator 210 is structured to provide the correct output signals.

The sensor electrode may be coupled to the signal generation means or circuit (including for example the output amplifier 220 and/or the output bandpass filter 230) as well as evaluation means (including for example an input bandpass filter 310). This coupling may be achieved by galvanic coupling or by capacitive coupling. The signals at the sensor electrode are coupled to the input bandpass filter 310 that, in operation, filters unwanted signal components coupled into the sensor electrode and may provide some overvoltage protection. Furthermore, the embodiment may be equipped with an input voltage divider: as noise cancellation in the synchronous rectifier only works when the noise signal is in the linear range of the input circuit, such voltage divider increases the dynamic range. The output of the input bandpass filter 310 is coupled to the input of a first switch 321 and the input of a second switch 322. Both switches 321, 322 are controlled by the signal of the signal generator 220, but are operated invertedly (reciprocally). To carry such inverted operation, an inverter 323 can be inserted into the control line of one of the switches 321, 322. Accordingly, for example, the first switch 321 may be "on" if the output signal produced by the signal generator is above the mean output value. During that "on" time duration, the second switch 322 may be "off". If the output signal of signal generator 210 is below the mean output value, the first switch 321 may be "off" while the second switch 322 may be "on". Of course, this relationship may be inverted (such that the first switch 321 may be "off" if the signal generator 210 has a higher value and the second switch 322 may be "on" during that time). The output signals of the first switch 321 is fed into a first input low pass filter 331, and the output of the second switch 322 is fed into a second input low pass filter 332. The output signals of both low pass filters (configured to pass frequencies that are lower than the frequency of a signal produced by the signal generator) are coupled to a differential amplifier 340, which generates a signal corresponding to and representing the difference voltage between the output signals arriving from the low pass filters. This difference signal may be delivered to an analog digital converter (ADC) 390. Preferably, the signal generator 210 and the ADC 390 are parts of a microcontroller 400.

In the following, the synchronous rectifier is described in more detail. When the signal generator 210 generates a high output signal, the first switch 321 is "on" and the second switch 322 is "off". With a low output signal from the signal generator 210, the stages of the switches 321, 322 are inverted. As the first switch 321 is always closed with a higher signal, the positive portions of the sensor signal (that is, the ones having positive values) are always collected and averaged by the first input low pass filter 331. As the second switch 322 is always "on" when the output signal from signal generator is low, the negative portions of the signals (the ones with values below zero) are collected and averaged by the second input low pass filter 332. Therefore, the output of the first input low pass filter 331 represents an average of the positive signal components, whereas the output of the second input low pass filter 332 represents the average of the negative signal components or portions. Only if there is a correlating signal, would the synchronous rectifier produce sufficient positive and negative signals at the output of both input low pass filters. For the case that there is an uncorrelated signal (representing no correlation), the output of the first input low pass filter 331 would be approximately the same as the output of the second input low pass filter 332, and therefore the output of the differential amplifier 340 would be approximately zero, indicating no significant signal. To obtain a high accuracy and a high noise suppression, all the circuit components (except for the sensor electrode) may have a reference to a common circuit ground. This means that at least the output of the signal generator 210 may provide a signal referenced to the circuit ground and the ADC 390 has an input referenced to said circuit ground. Preferably the filters and amplifiers also are referenced to such circuit ground.

Figure 2:
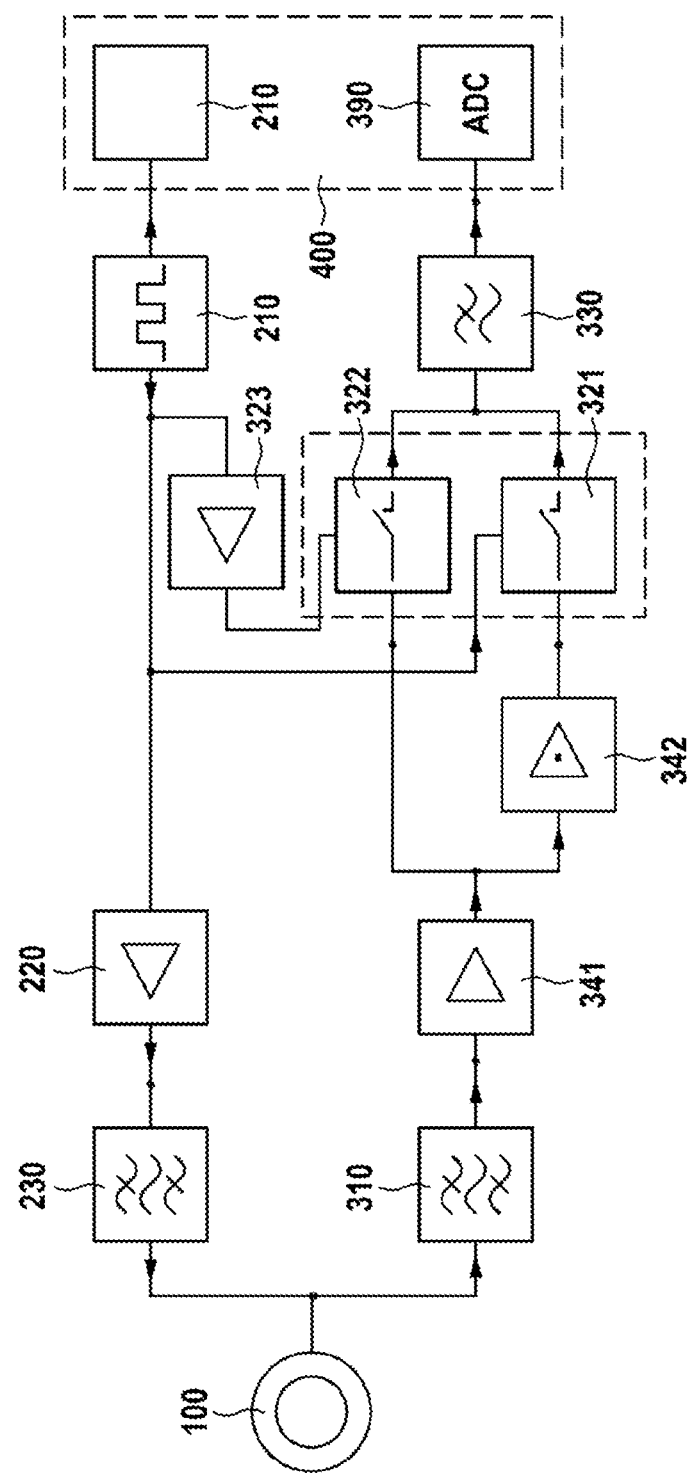
FIG. 2 illustrates a further embodiment.

In FIG. 2, a related embodiment is illustrated. Here, the signal generation circuit is structured to be substantially the same as that discussed in reference to FIG. 1. The main difference is in the synchronous rectifier. Here, the input signal of the first switch 321 is inverted by an inverting amplifier 342, which has an amplification factor of −1. The input signal to the second switch 322 is not inverted. A general input amplifier 341 may be employed behind the input bandpass filter 310. Such amplifier 341 may be useful to increase the signal amplitude and/or to lower the signal impedance, such as to make the signal be easier to process at the following stages of the circuitry. In general, such an input amplifier 341 may be used in any of the embodiments described herein. The output signals from the first switch 321 and the second switch 322 are combined and fed to a common single input low pass filter 330 (configured to pass signals within the range of frequencies that is lower than the frequency of a signal produced by the signal generator), the output signal from which in turn is further provided to the ADC 390. Herein, the switches are configured to operate in the same fashion as that described in the embodiment of FIG. 1.

Figure 3:
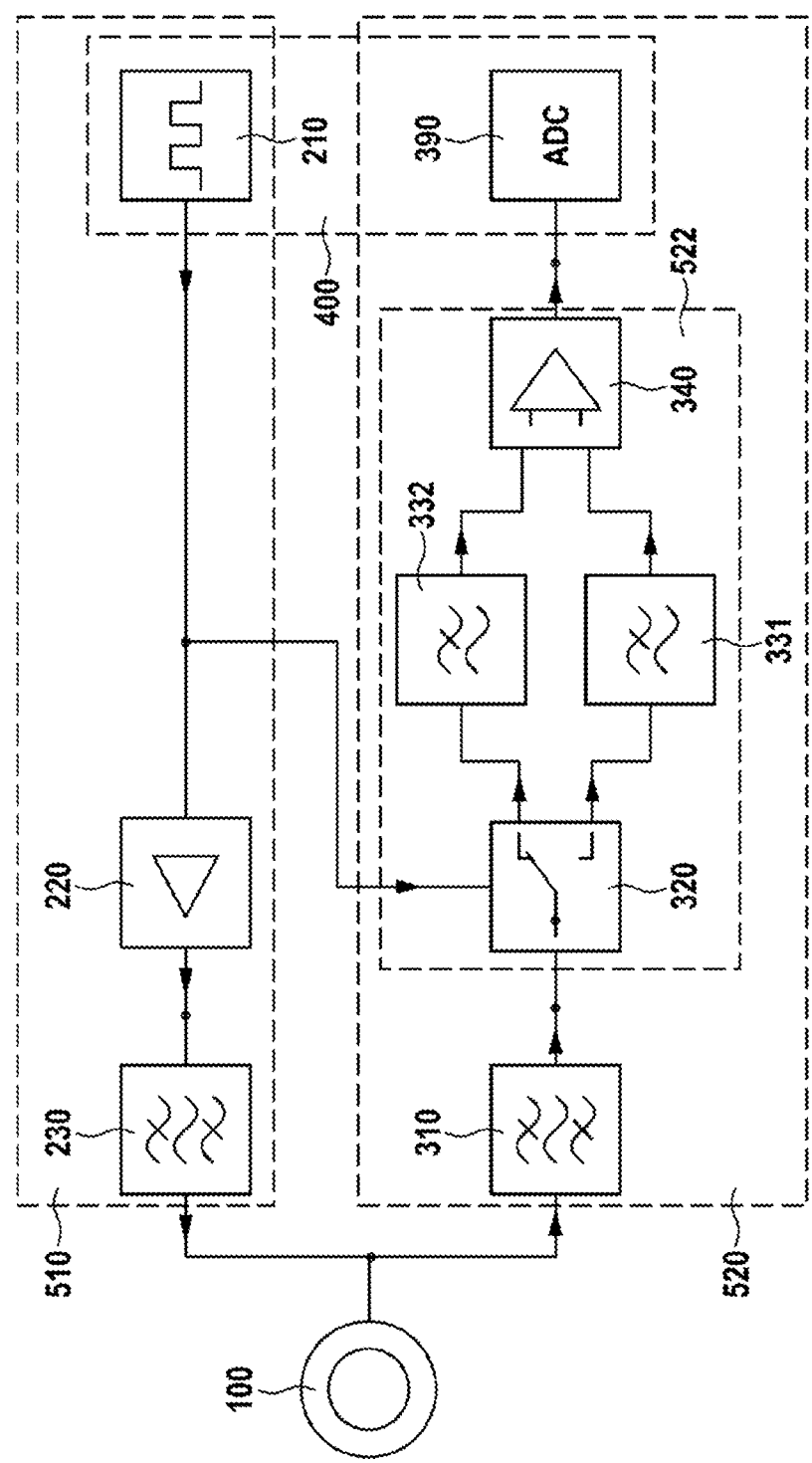
FIG. 3 presents another embodiment.

In FIG. 3, yet another embodiment is presented, which is similar to the embodiment of FIG. 1. The main difference between the embodiments of FIGS. 3 and 1 is that in the former there exists a single pole double throw (SPDT) switch 320 replacing first switch 321, second switch 322, and inverter 323 of the embodiment of FIG. 1. FIG. 3 also illustrates the main functional blocks of the invention, which are also common to (that is, may be present in) the other embodiments. A signal generation means or circuit 510 includes at least a signal generator and may include signal-forming and/or amplifier electronic circuitry. A signal evaluation means or circuit 520 includes at least a synchronous rectifier 522 synchronized to the signal generator and may include further filtering circuitry.

Figure 4:
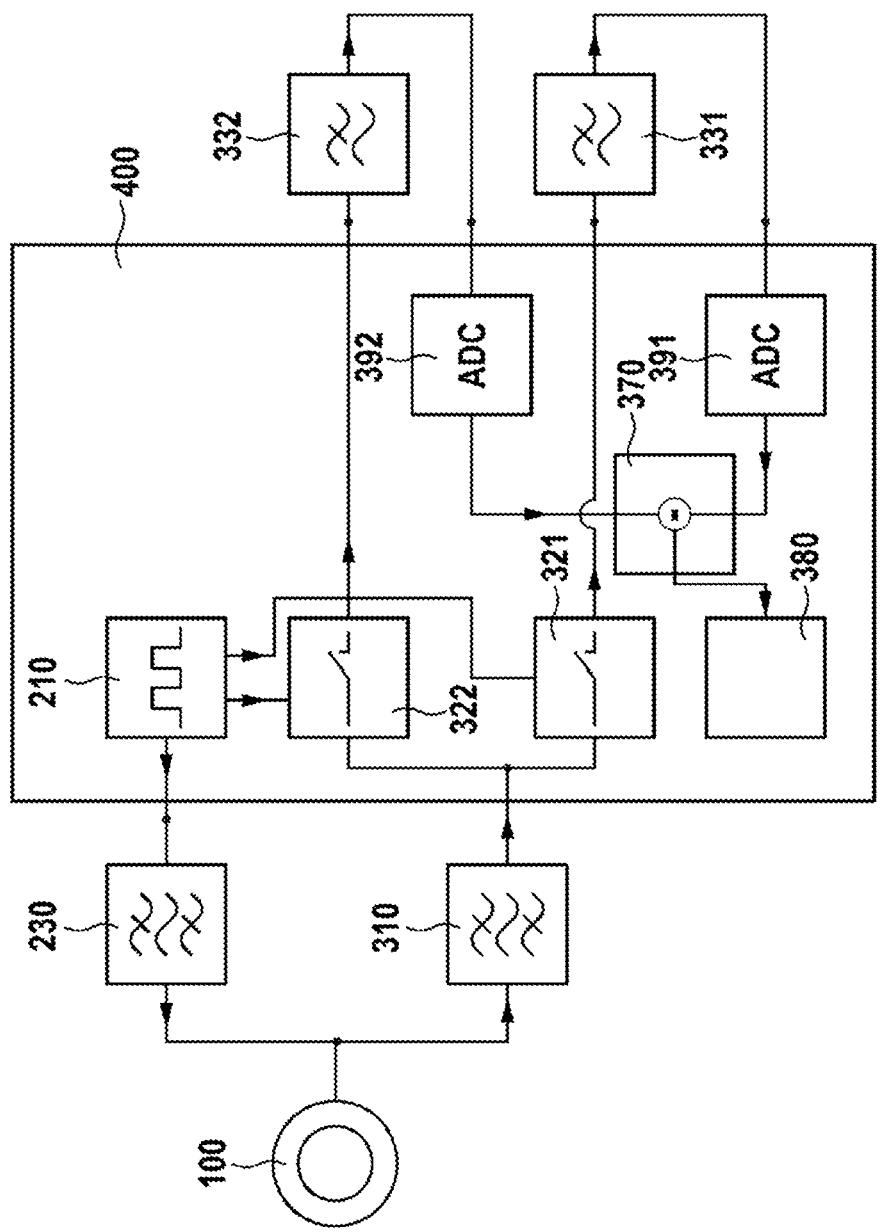
FIG. 4 depicts another embodiment in a microcontroller.

FIG. 4 illustrates another related embodiment implemented with the use of a standard microcontroller. Here, the signal generator 210—which may be a clock divider or a serial output interface—is a part of the microcontroller 400. If the amplitude of the signal from the signal generator is not sufficient, an output amplifier (not shown) between the signal generator and the output bandpass filter may be additionally utilized (as shown in the embodiments discussed in reference to FIGS. 1, 2, and 3). The input bandpass filter 310 (that may have a lower frequency of operation in a range from 1 kHz to 10 kHz and an upper frequency of operation in a range from 10 MHz to 200 MHz, in one example) is followed by the first switch 321 and the second switch 322. The output from first switch 321 is connected to an external first input low pass filter 331, which in turn is connected to an internal ADC 391. The output of the second switch 322 is coupled to a second input low pass filter 332, which is further operably coupled to another internal ADC 392. As a skilled artisan will readily appreciate, instead of utilizing two separate ADCs, a combination of one ADC and a multiplexer at the input of the ADC can be used. The digital values of the first ADC 391 and the second ADC 392 are subtracted by a difference calculator 370 and fed to an evaluation unit 380. The internal ADCs 391, 392 may be configured to have a sampling frequency between 2 kHz and 4 kHz. Instead of two ADCs only a single ADC with an input multiplexer may be used. Such an input multiplexer may switch multiple input signals to a common ADC. The first input low pass filter 331 and the second input low pass filter 332 may be configured as first order analog filters (a series resistor and a parallel capacitor—e.g. a capacitor coupled to circuit ground). Alternatively or in addition, the difference calculator 370 and the evaluation unit 380 may be implemented in software. The using of one microcontroller facilitates the evaluation of multiple sensor signals. In this embodiment, two pins of the microcontroller are used to connect external components (low pass filter) per ADC. This configuration results in a total of 5 pins (4 filter pins and one input pin from the input bandpass filter 310) for a sensor electrode 100. If the signals of multiple sensor electrodes are evaluated, the number of pins is the number of electrodes multiplied by 5.

Figure 5:
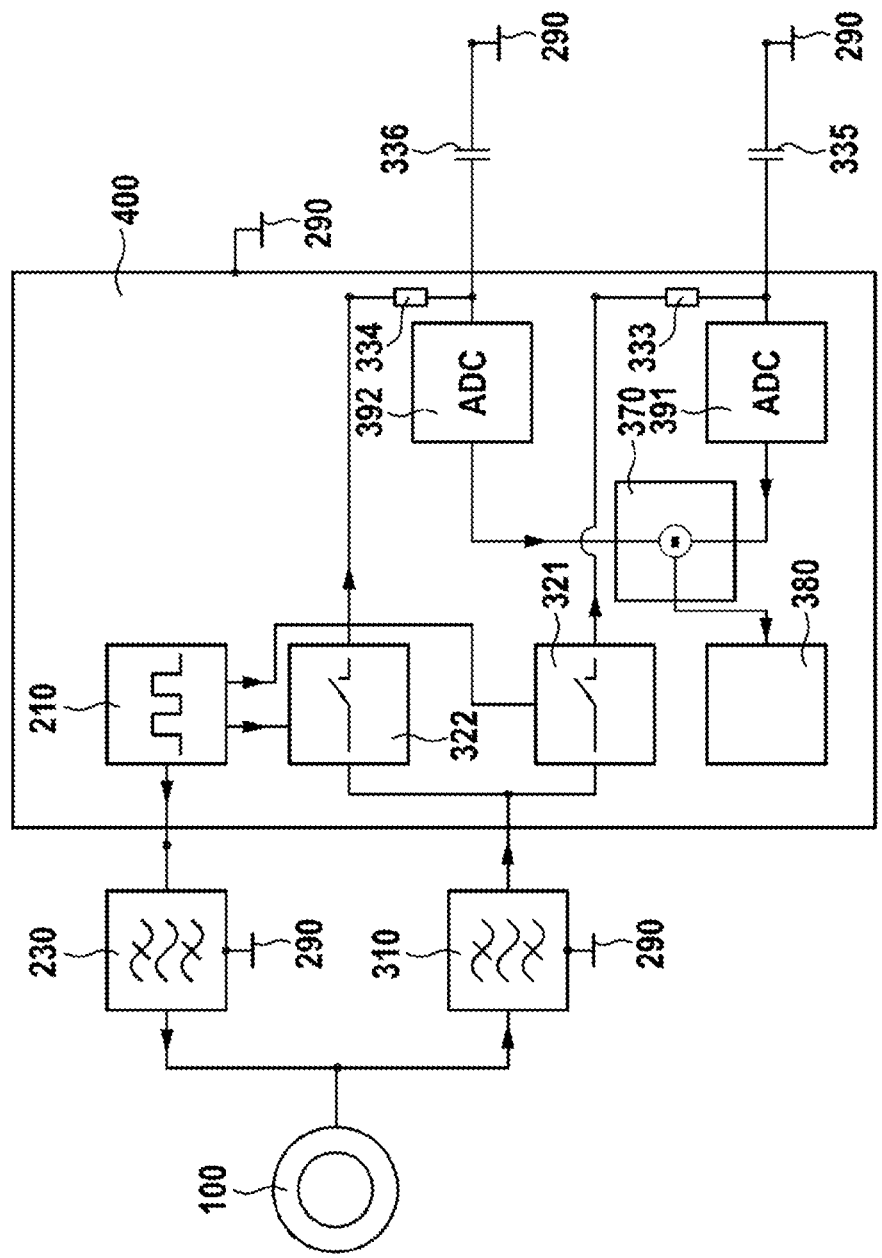
FIG. 5 shows a very simple embodiment in a microcontroller.

In FIG. 5, a very simple embodiment of the invention based on a microcontroller is presented. Here, the first input low pass filter 331 is implemented with a first resistor 333 (which may be part of the microcontroller 400 chip) and a first capacitor 335 (which may be external to the microcontroller 400). The second input low pass filter 332 is implemented with a second resistor 334 (which may be part of the microcontroller 400 chip) and a second capacitor 336 (which may be external to the microcontroller 400). Preferably, the capacitors are coupled to circuit ground. As a result of using one microcontroller, multiple sensor signals may be evaluated. In this embodiment, only one pin of the microcontroller per ADC is used to connect external components (capacitor). This configuration results in a total of 3 pins (2 capacitor pins and one input pin from the input bandpass filter 310) for a sensor electrode 100. If the signals of multiple sensor electrodes are evaluated, the number of pins is the number of electrodes multiplied by 3. Therefore, this embodiment produces in significant saving over the previous embodiment of FIG. 4. In a slightly modified case, the first resistor 333 and second resistor 334 may be configured to be external to the microcontroller. In such a case, there may only be one microcontroller, 6 resistors and 4 capacitors, where two resistors and one capacitor may form each of the filters 230 and 310. Preferably, these filters 230, 310 refer to circuit ground 290, for example by coupling the capacitors to circuit ground. For example, each of these filters may include a voltage divider and a parallel capacitor.

In one implementation, a synchronous rectifier is based on a first switch 321 synchronized with a second switch 322, both switches having opposing switching states, and followed by two low pass filters (333, 335, 334, 336) or integrating circuits. Each of the low pass filters is connected to a corresponding individual ADC 391, 392. The values at the outputs from the ADCs 391, 323 are then further evaluated, e.g. by subtracting them and optionally making offset compensations with the microcontroller 400. Optionally, any of the switches, filters, ADCs may be integrated into or external to the microcontroller. This simply-configured embodiment allows for operation at a high sampling rate with higher precision without any crosstalk (that may be otherwise caused by a multiplexing switch which may be used in conjunction with a single ADC). Furthermore, the proposed circuit is operational without any amplifiers between the sensor electrode and the ADC. This significantly simplifies the total circuit design, reduces the size of the switch and reduces costs.

Figure 6:
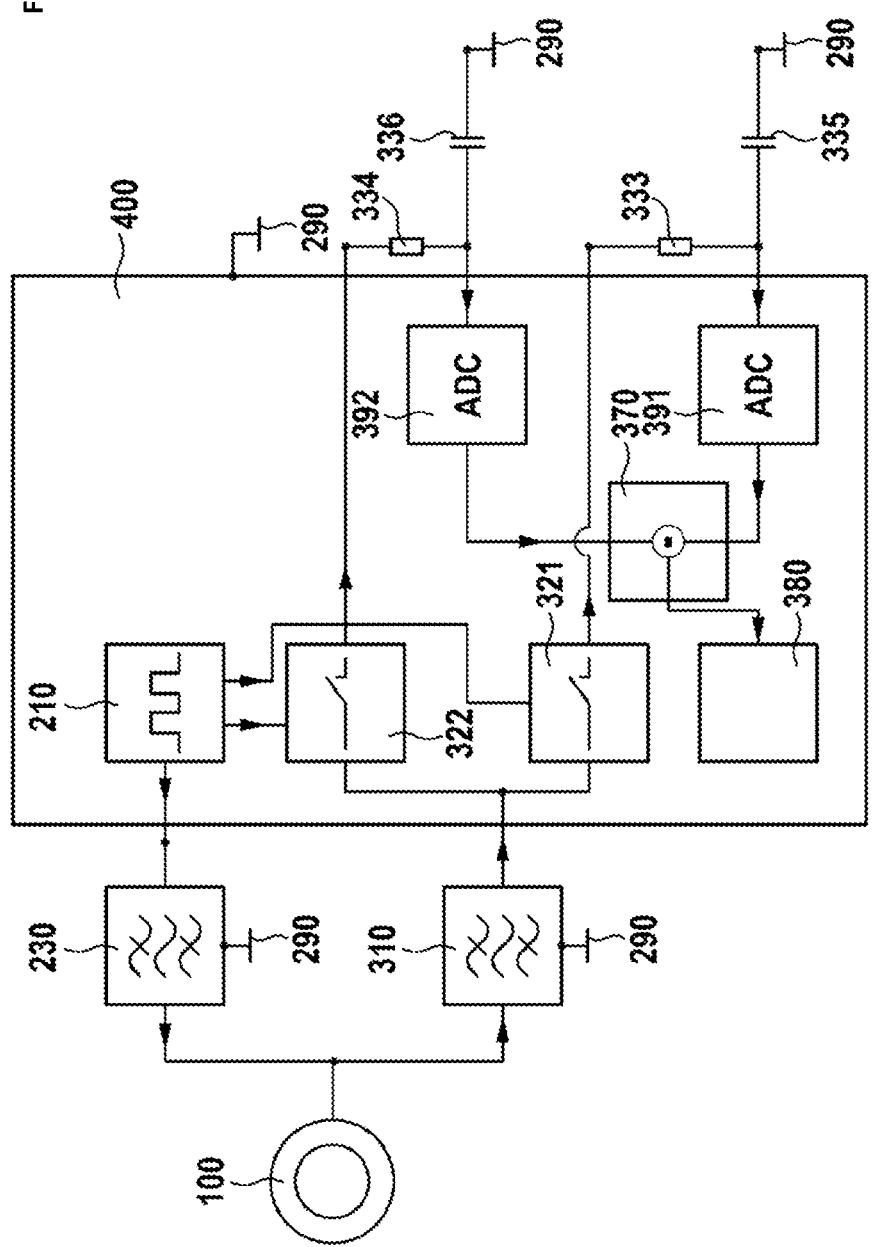
FIG. 6 presents a further simple embodiment in a microcontroller.

FIG. 6 schematically illustrates a similar embodiment. Here, the first resistor 333 and second resistor 334 are outside the microcontroller between the switches and the ADCs.

Figure 7:
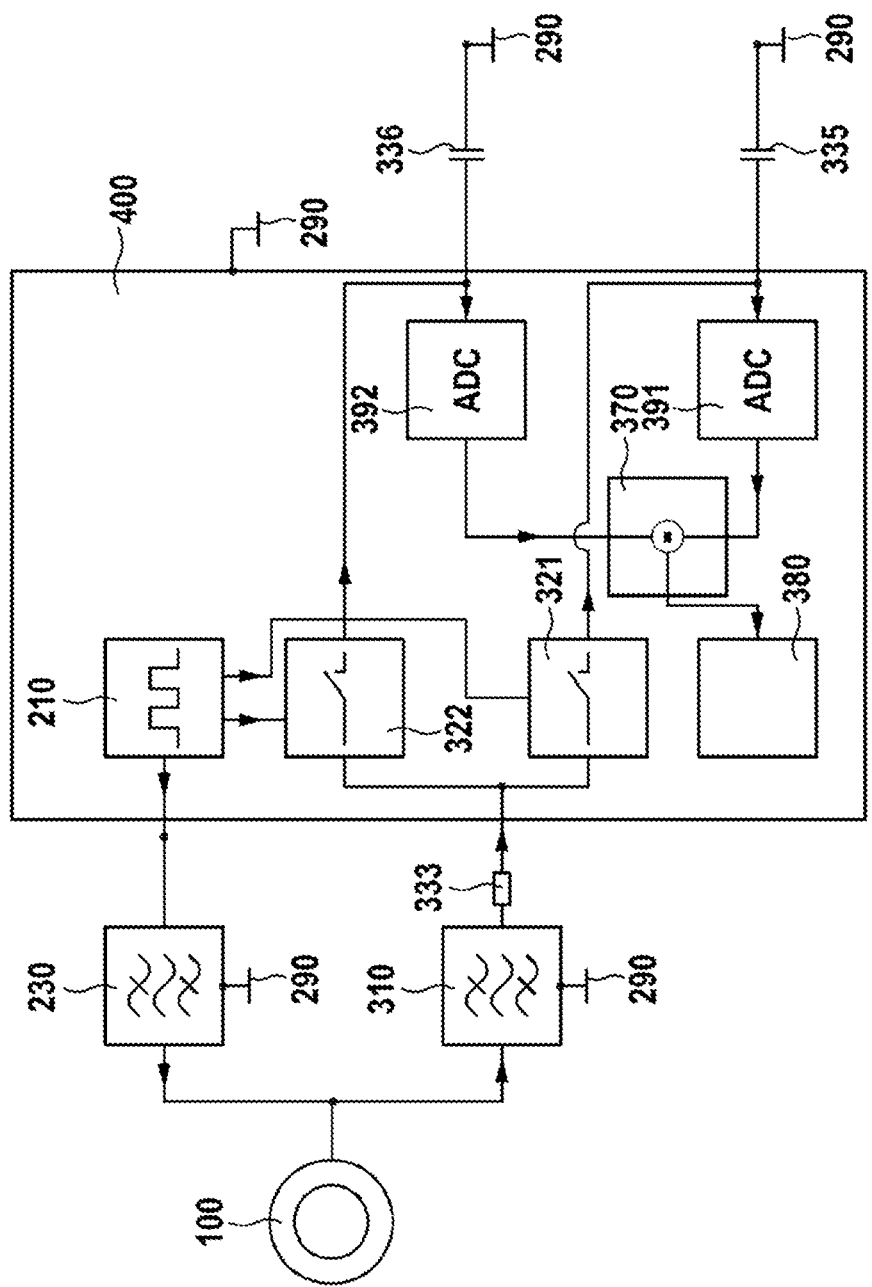
FIG. 7 shows another simple embodiment in a microcontroller.

In FIG. 7, another embodiment is shown. Here, there is only one resistor 333 between the input bandpass filter 310 and the switches. There may also be two separate resistors in front of every switch. The resistor(s) may either be inside or outside of the microcontroller.

Figure 8:
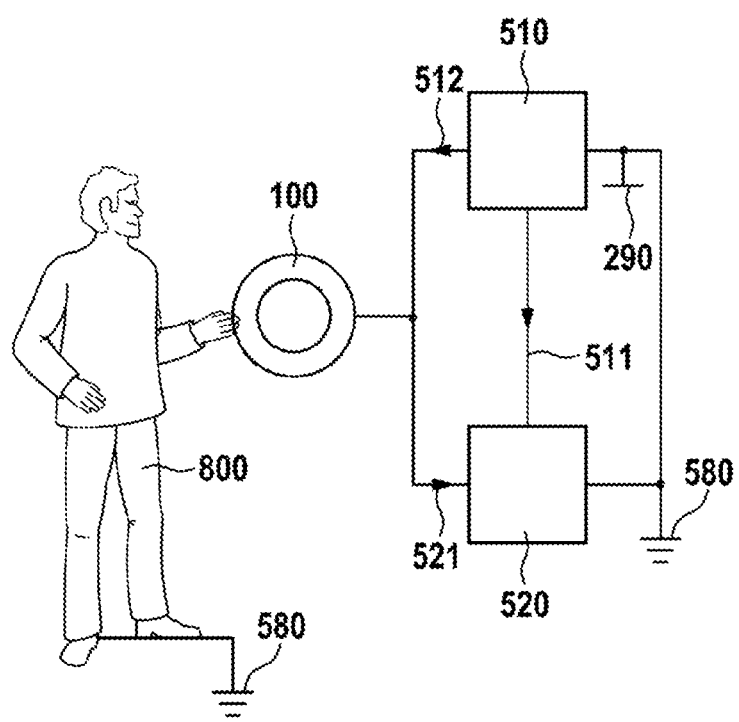
FIG. 8 shows a basic concept of the capacitive sensor.

FIG. 8 illustrates the basic concept of the capacitive sensor. The sensor electrode 100 is coupled to a signal generation circuit 510, which is configured to produce an output signal 512, and to a signal evaluation circuit 520 that receives and evaluates an input signal 521. Both the signal generation circuit 510 and the signal evaluation circuit 520 refer to circuit ground 290, which is in turn coupled to a ground 580. The ground 580 may be a protective ground. It may also be considered as a physical ground. The situation may be viewed alternatively, in that there is a circuit ground 290, to which all circuit components of the sensor switch refer and which may be contained within a common housing. There is also an environmental ground to which the environment and a person in the environment of the switch refers. This environmental ground is also referred herein as ground 580. In practice, a situation is possible when there may not be a galvanic coupling between the circuit ground 290 and ground 580 as shown in the symbolic diagram of FIG. 8. Instead, there may be coupling through any capacitance or even a parasitic capacitance for example from the sensor switch housing to ground. A person 800, who also refers to ground 580 by, for example, standing on a floor, may touch the sensor electrode 100 and therefore cause a bypass of the signal from the sensor electrode 100 to the ground 580. This bypassing attenuates the signal at the sensor electrode. Such an attenuation may be detected by the signal evaluation circuit 520. As the signal evaluation circuit 520 has a synchronous detector, it requires a synchronization signal from the signal generation circuit 510 which may be provided by a synchronization signal line 511. In an alternative embodiment, the synchronous signal may be regenerated from the input signal to signal evaluation circuit 520, for example by means of a phase-looked loop (PLL).

Figure 9:
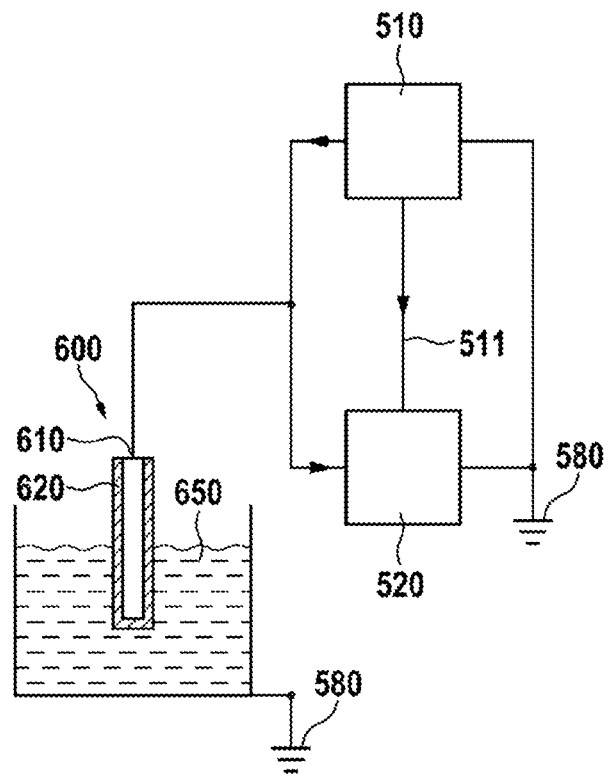
FIG. 9 schematically illustrates a liquid sensor.

In FIG. 9, a liquid sensor 600 is shown. The sensor 600 has a sensor electrode (configured to include a conductive, e.g. metal, rod or tube 610). Preferably, this sensor electrode has some insulation 620 thereon to avoid galvanic contact with surrounding liquid 650 that may be contained in a tank 660. Preferably, the tank 660 is at least partially conductive and refers to the same ground 580 as the shown circuit. As the level of liquid 650 in the tank 660 increases, the capacity of the sensor electrode 610 to ground 580 increases, and therefore the signal amplitude as measured by the signal evaluation circuit is decreased. Understandably, this embodiment is configured to be operable with either conductive liquids or non-conductive liquids (as non-conductive liquids provide a higher dielectric constant ε compared to air, and therefore a higher liquid level provides a higher capacitance).

Figure 10:
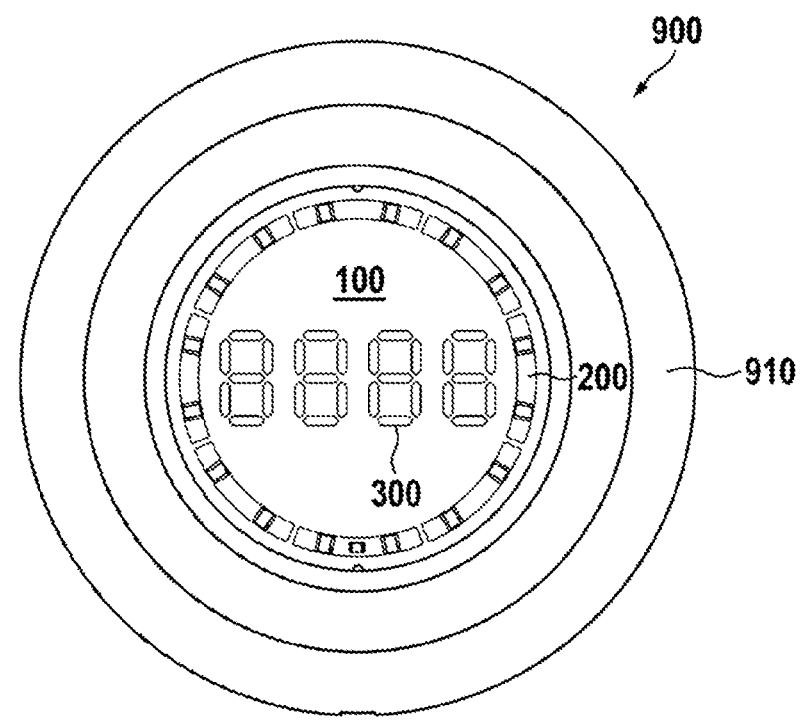
FIG. 10 shows a front view of a capacitive sensor switch.

In FIG. 10 a front side 901 of a capacitive sensor switch 900 of an embodiment of the invention is shown. It includes a housing 910 incorporation a sensor electrode 100, of which a ring-shaped display 200 and a digit display 300 are shown. There may be any other types of display and any combination thereof. In a related embodiment, the switch has only a sensor surface without display. The diameter of such a capacitive sensor switch may be in the range from 20 mm to 150 mm, or between 40 mm and 80 mm in the alternative.

Figure 11:
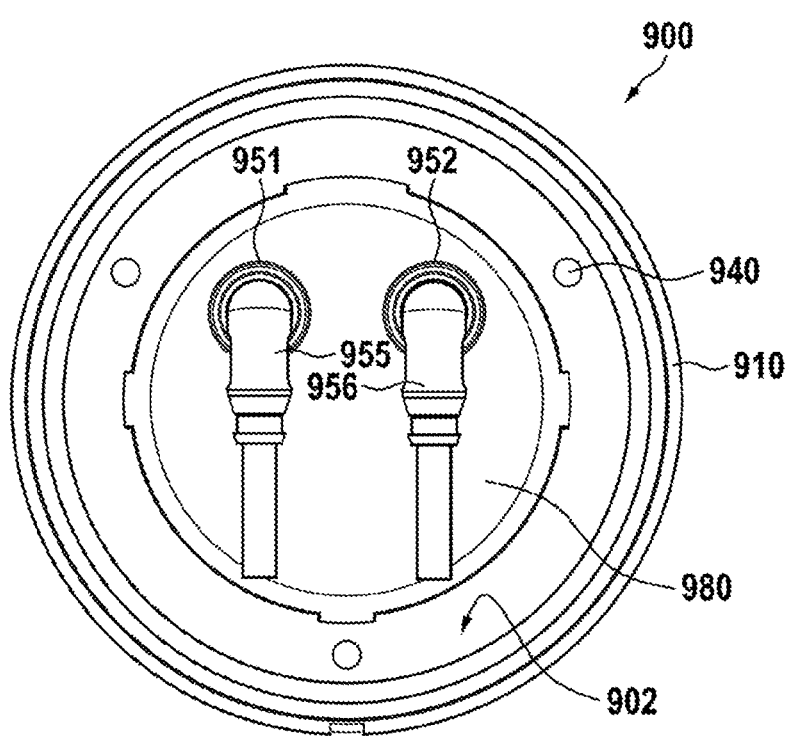
FIG. 11 shows an embodiment from the rear side.

FIG. 11 illustrates a back or rear side 902 of, the embodiment of the sensor switch 900. There may be employed fixation means 940 (configured as, for example, screw holes either suitable for self-tapping screws or having threads). Furthermore, there may be connectors configured to connect a power supply and/or a bus or a network. As shown in this example, the embodiment employs two connectors to allow daisy chaining of a bus. There may be a first bus connector 951 for a first cable connector 955 and a second bus connector 952 for a second cable connector 956. The rear side 902 may either have a cover or may include a casting compound 980. The interior of the housing, but preferably not the light channels, may be filled with a casting compound.

Figure 12:
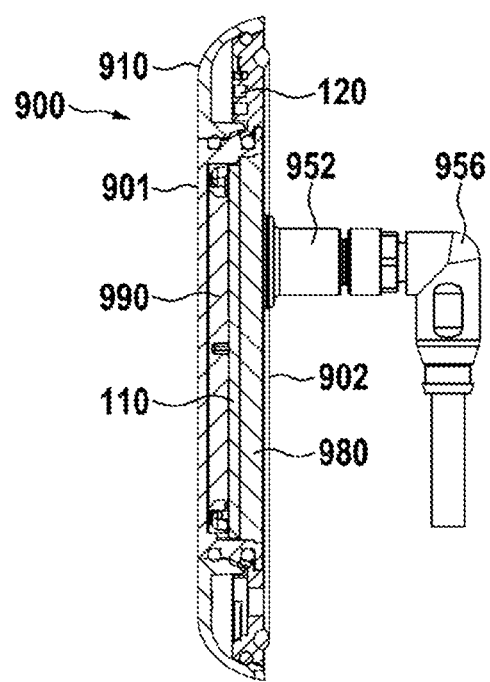
FIG. 12 shows a sectional side view of an embodiment.

In FIG. 12, a sectional side view of the embodiment of a capacitive sensor switch 900 is shown schematically. This sectional side view represents a vertical cross-section through the center of FIG. 11. Here, the details of the sensor assembly are illustrated. A printed circuit board (PCB) 110 may hold a sensor circuit 120. A cover disk 990 is shown to be mounted on top of the printed circuit board 110. Preferably, the cover disk 990 allows for a space between the printed circuit board 110 and the housing 910.

It will be appreciated to those skilled in the art having the benefit of this disclosure that this invention is believed to provide capacitive sensor switches. Further modifications and alternative embodiments of various aspects of the invention will be apparent to those skilled in the art in view of this description. Accordingly, this description is to be construed as illustrative only and is provided for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

LIST OF REFERENCE NUMERALS 100 sensor electrode
110 PCB (printed circuit board)
120 sensor circuit
210 signal generator
220 output amplifier
230 output band pass filter
290 circuit ground
310 input bandpass filter
320 SPDT (single pole double throw) switch
321 first switch
322 second switch
323 inverter
330 single input low pass filter
331 first input low pass filter
332 second input low pass filter
333 first resistor
334 second resistor
335 first capacitor
336 second capacitor
340 differential amplifier
341 input amplifier
342 inverting amplifier
380 evaluation unit (electronic circuitry)
390 single input ADC (analog digital converter)
391 first input ADC (analog digital converter)
392 second input ADC (analog digital converter)
370 difference calculator (electronic circuitry)
400 microcontroller
510 signal generation circuit
511 synchronization signal
512 output signal
520 signal evaluation circuit
521 input signal
522 synchronous rectifier
580 ground
600 liquid sensor
610 sensor electrode
620 insulation
650 liquid
660 tank
800 person
900 sensor switch
901 front side
902 rear side
910 housing
940 fixation means
951 first bus connector
952 second bus connector
955 first cable connector
956 second cable connector
980 casting compound
990 cover disk

The invention claimed is:

1. A capacitive sensor comprising:
an electrode entity comprising a single sensor electrode, a signal generation circuit, and a signal evaluation circuit;
wherein the electrode entity is connected to the signal generation circuit configured to generate an output signal to the sensor electrode; and
wherein the electrode entity is connected via a single signal path to the signal evaluation circuit that is configured to evaluate an input signal acquired from the electrode entity via said single signal path,
the signal generation circuit comprising a signal generator chosen to be one of a noise generator, a pseudo-noise generator, a chirp signal generator, and a frequency sweep signal generator,
the signal evaluation circuit comprising a synchronous rectifier,
wherein the synchronous rectifier comprises a first switch and a second switch, wherein the first switch and the second switch are connected to the signal generator and configured for alternating switching in phase with the input signal,
wherein each of the signal generation circuit and the signal evaluation circuit refers to a circuit ground.

2. The capacitive sensor according to claim 1,
wherein the synchronous rectifier comprises:
a first input lowpass filter coupled to an output of the first switch,
a second input lowpass filter coupled to an output of the second switch, and
a differential amplifier connected to the first input lowpass filter and to the second input lowpass filter.

3. The capacitive sensor according to claim 2,
wherein the signal evaluation circuit comprises a first analog digital converter (ADC) coupled to the first input lowpass filter and a second ADC coupled to the second input lowpass filter, and/or
wherein the signal evaluation circuit comprises an input voltage divider.

4. The capacitive sensor according to claim 3, further comprising an input bandpass filter configured to add a DC bias voltage to the input signal from the electrode entity such that the lowest output voltage of the synchronous rectifier and the highest output voltage of the synchronous rectifier fall within a dynamic range of the first ADC and/or a dynamic range of the second ADC.

5. The capacitive sensor according to claim 4, comprising a microcontroller that incorporates said synchronous rectifier and the first ADC and the second ADC.

6. The capacitive sensor according to claim 5, wherein said microcontroller incorporates the signal generation circuit.

7. The capacitive sensor according to claim 2,
wherein an input of the first switch and an input of the second switch are connected together.

8. The capacitive sensor according to claim 7, wherein the first switch and the second switch are part of a single-pole-double-throw (SPDT) switch.

9. The capacitive sensor according to claim 1,
wherein the synchronous rectifier comprises an inverting amplifier connected at an input of the first switch and a single input lowpass filter with an input of the single input lowpass filter connected to combined outputs of the first switch and the second switch.

10. The capacitive sensor according to claim 9,
wherein the signal generation circuit comprises one analog digital converter (ADC) coupled to the single input lowpass filter, and/or wherein the signal evaluation circuit comprises an input voltage divider.

11. The capacitive sensor according to claim 10, comprising a microcontroller that incorporates said synchronous rectifier and the one ADC.

12. The capacitive sensor according to claim 11, wherein said microcontroller incorporates the signal generation circuit.

13. The capacitive sensor according to claim 10,
wherein the input of the first switch and the input of the second switch are connected together;
wherein an output of the first switch is connected to a first input low pass filter and an output of the second switch is connected to a second input low pass filter.

14. The capacitive sensor according to claim 1,
further comprising an input bandpass filter and one analog digital converter (ADC) connected to an output of the synchronous rectifier,
wherein the input bandpass filter is configured to add a DC bias voltage to the input signal from the electrode entity such that the lowest output voltage from the synchronous rectifier and the highest output voltage from the synchronous rectifier are within a dynamic range of the one ADC.

15. The capacitive sensor according to claim 1, wherein the signal generation circuit comprises an output bandpass filter connected between the signal generator and the electrode entity and/or the signal generation circuit comprises an output amplifier connected to an output of the signal generator.

16. The capacitive sensor according to claim 1, wherein the circuit ground is coupled to an environmental ground.

17. The capacitive sensor according to claim 1, comprising a first low pass filter, a second low pass filter, and
a microcontroller that incorporates the first switch, the second switch, a first input ADC, a second input ADC,
wherein the signal evaluation circuit comprises the first switch connected to the first input low pass filter that is external to the microcontroller, the first input low pass filter being further connected to the first input ADC,
wherein the signal evaluation circuit comprises the second switch connected to the second input low pass filter that is external to the microcontroller, the second input low pass filter being further connected to the second input ADC,
wherein the signal evaluation circuit comprises a difference calculator configured to subtract outputs of the first input ADC and the second input ADC.

18. The capacitive sensor according to claim 17, wherein the single sensor electrode covers a significant part of a surface of a sensor housing.

19. The capacitive sensor according to claim 18, wherein the largest extension of the sensor housing is smaller than 15 cm.

20. A capacitive sensor comprising:
a sensor electrode, a signal generation circuit, and a signal evaluation circuit;
wherein the sensor electrode is connected to the signal generation circuit configured to generate an output signal to the sensor electrode; and
wherein the sensor electrode is connected to the signal evaluation circuit configured to evaluate an input signal acquired from the sensor electrode,
the signal generation circuit comprising a signal generator chosen to be one of a noise generator, a pseudo-noise generator, a chirp signal generator, and a frequency sweep signal generator,
the signal evaluation circuit comprising a synchronous rectifier,
the synchronous rectifier comprising a first switch, and a second switch, wherein the first switch and the second switch are connected to the signal generator and configured for alternating switching in phase with the input signal, and
wherein each of the signal generation circuit and the signal evaluation circuit refers to a circuit ground,
the capacitive sensor further comprising:
a first low pass filter, a second low pass filter, and
a microcontroller that incorporates the first switch, the second switch, a first input ADC, a second input ADC,
wherein the signal evaluation circuit comprises the first switch connected to the first input low pass filter that is external to the microcontroller, the first input low pass filter being further connected to the first input ADC,
wherein the signal evaluation circuit comprises the second switch connected to the second input low pass filter that is external to the microcontroller, the second input low pass filter being further connected to the second input ADC,
wherein the signal evaluation circuit comprises a difference calculator configured to subtract outputs of the first input ADC and the second input ADC.

21. The capacitive sensor according to claim 20, wherein the signal generation circuit comprises an output bandpass filter connected between the signal generator and the sensor electrode and/or the signal generation circuit comprises an output amplifier connected to an output of the signal generator.

22. The capacitive sensor according to claim 20, wherein the synchronous rectifier comprises an inverting amplifier connected at an input of the first switch and a single input lowpass filter with an input of the single input lowpass filter connected to combined outputs of the first switch and the second switch.

* * * * *